US010553759B2

(12) United States Patent
Gauthier-Brun et al.

(10) Patent No.: US 10,553,759 B2
(45) Date of Patent: Feb. 4, 2020

(54) LIGHT-EMITTING DEVICE

(71) Applicant: EPISTAR CORPORATION, Hsinchu (TW)

(72) Inventors: Aurelien Gauthier-Brun, Hsinchu (TW); Chao-Hsing Chen, Hsinchu (TW); Chang-Tai Hsaio, Hsinchu (TW); Chih-Hao Chen, Hsinchu (TW); Chi-Shiang Hsu, Hsinchu (TW); Jia-Kuen Wang, Hsinchu (TW); Yung-Hsiang Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/035,299

(22) Filed: Jul. 13, 2018

(65) Prior Publication Data

US 2019/0019919 A1    Jan. 17, 2019

(30) Foreign Application Priority Data

Jul. 13, 2017  (TW) .............................. 106123445 A
Jul. 4, 2018   (TW) .............................. 107123088 A

(51) Int. Cl.
*H01L 33/38*  (2010.01)
*H01L 33/08*  (2010.01)
(Continued)

(52) U.S. Cl.
CPC ............ *H01L 33/387* (2013.01); *H01L 33/08* (2013.01); *H01L 33/24* (2013.01); *H01L 33/32* (2013.01);
(Continued)

(58) Field of Classification Search
CPC ........ H01L 33/387; H01L 33/24; H01L 33/08
See application file for complete search history.

(56) References Cited

U.S. PATENT DOCUMENTS 8,592,837 B2    11/2013  Hodota et al.
8,946,675 B2    2/2015   Yu et al.
(Continued)

FOREIGN PATENT DOCUMENTS

TW    201128805 A    8/2011
TW    201401550 A    1/2014

OTHER PUBLICATIONS

Dhar, A. "High quality transparent TiO2/Ag/TiO2-composite electrode films deposited on flexible substrate at room temperature by sputtering" APL Materials vol. 1, iss. 1 Jun. 6, 2013 (Year: 2013).*

*Primary Examiner* — Grant S Withers
(74) *Attorney, Agent, or Firm* — Ditthavong & Steiner P.C.

(57) ABSTRACT

A light-emitting device includes a first semiconductor layer; a plurality of semiconductor pillars separated from each other and formed on the first semiconductor layer, the plurality of semiconductor pillars respectively includes a second semiconductor layer and an active layer; a first electrode covering one portion of the plurality of semiconductor pillars; and a second electrode covering another portion of the plurality of semiconductor pillars, wherein the plurality of semiconductor pillars under a covering region of the first electrode are separated from each other by a first space, the plurality of semiconductor pillars outside the covering region of the first electrode are separated from each other by a second space, and the first space is larger than the second space.

18 Claims, 5 Drawing Sheets

(51) Int. Cl.
*H01L 33/24* (2010.01)
*H01L 33/32* (2010.01)
*H01L 33/44* (2010.01)
H01L 33/42 (2010.01)
H01L 33/40 (2010.01)

(52) U.S. Cl.
CPC ............ *H01L 33/44* (2013.01); *H01L 33/405* (2013.01); *H01L 33/42* (2013.01)

(56) References Cited

U.S. PATENT DOCUMENTS

2009/0246901 A1  10/2009  Gilet et al.
2013/0105827 A1* 5/2013  Kim ........................ H01L 27/15
                                                257/88

* cited by examiner

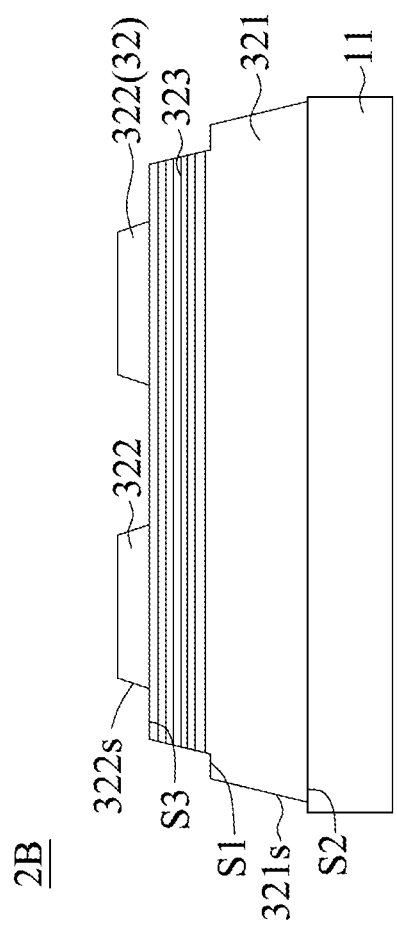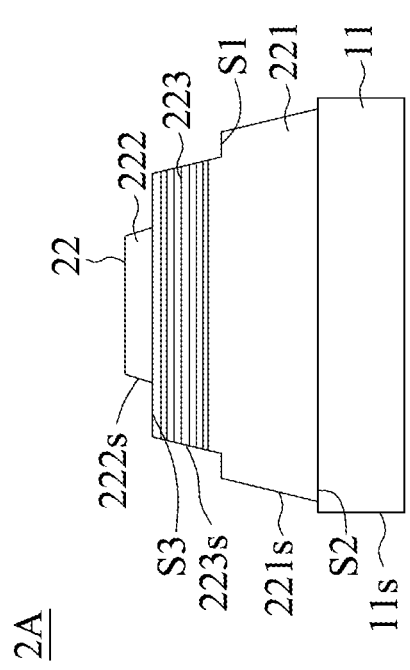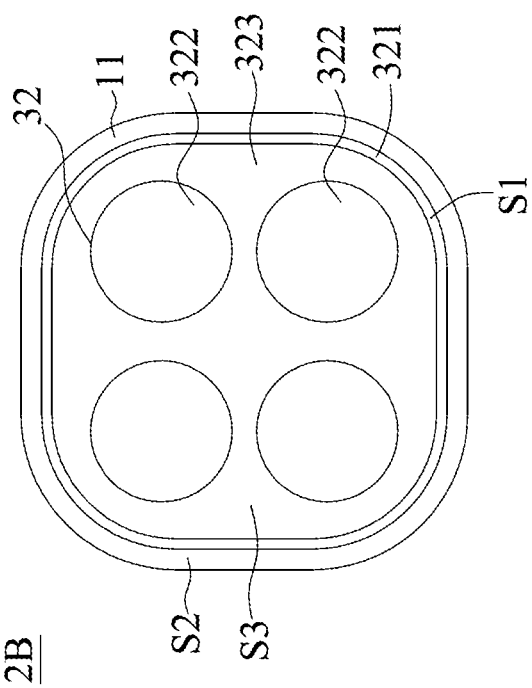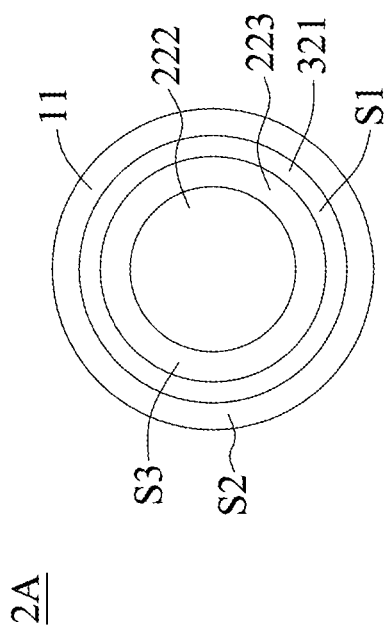
FIG. 3A
FIG. 3B
FIG. 4A
FIG. 4B

LIGHT-EMITTING DEVICE

TECHNICAL FIELD

The application relates to a structure of a light-emitting device, and more particularly, to a light-emitting device emitting an ultraviolet light, including a first semiconductor layer and a plurality of semiconductor pillars on the first semiconductor layer.

REFERENCE TO RELATED APPLICATION

This application claims the right of priority based on TW Application Serial No. 106123445, filed on Jul. 13, 2017, the right of priority based on TW Application Serial No. 107123088, filed on Jul. 4, 2018, and the content of which are hereby incorporated by references in their entirety.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device includes a first semiconductor layer; a plurality of semiconductor pillars separated from each other and formed on the first semiconductor layer, the plurality of semiconductor pillars each including a second semiconductor layer and an active layer; a first electrode covering one part of the plurality of semiconductor pillars; and a second electrode covering another part of the plurality of semiconductor pillars, wherein the plurality of semiconductor pillars under a covering region of the first electrode includes a first space to separate from each other, the plurality of semiconductor pillars outside the covering region of the first electrode includes a second space to separate from each other, and the first space is larger than the second space.

A light-emitting device includes a first semiconductor layer; a plurality of semiconductor pillars separated from each other and formed on the first semiconductor layer, the plurality of semiconductor pillars each including a second semiconductor layer and an active layer; a first electrode covering one part of the plurality of semiconductor pillars; a second electrode covering another part of the plurality of semiconductor pillars; and a semiconductor mesa including the first semiconductor layer, the active layer and/or the second semiconductor layer under the first electrode, wherein the semiconductor pillars outside a covering region of the first electrode are separated from each other by a space, and the semiconductor mesa includes a width larger than the space between the semiconductor pillars.

A light-emitting device includes a first semiconductor layer; a plurality of semiconductor pillars separated from each other and formed on the first semiconductor layer, the plurality of semiconductor pillars each including a second semiconductor layer and an active layer; a first contact layer including a first contact portion and a first extending portion, the first contact portion including an area larger than an area of one of the plurality of semiconductor pillars, the first extending portion extending from the first contact portion and surrounding the plurality of semiconductor pillars; a first electrode covering one part of the plurality of semiconductor pillars; and a second electrode covering another part of the plurality of semiconductor pillars, wherein the first contact portion is under the first electrode or the second electrode, and the first extending portion is formed under the first electrode or the second electrode.

A light-emitting device includes a first semiconductor layer including a first upper surface; an active layer including a surface formed on the first semiconductor layer and exposing the first upper surface of the first semiconductor layer; and a second semiconductor layer formed on the active layer and exposing the surface of the active layer, wherein the light-emitting device emits a UV light.

BRIEF DESCRIPTION OF THE DRAWINGS

FIG. 3A illustrates a partial cross-sectional view of a light-emitting device 2A in accordance with an embodiment of the present application;

FIG. 3B illustrates a partial top view of the light-emitting device 2A in accordance with an embodiment of the present application;

FIG. 4A illustrates a partial cross-sectional view of a light-emitting device 2B in accordance with an embodiment of the present application;

FIG. 4B illustrates a partial top view of the light-emitting device 2B in accordance with an embodiment of the present application;

DETAILED DESCRIPTION OF PREFERRED EMBODIMENTS

Figure 1:
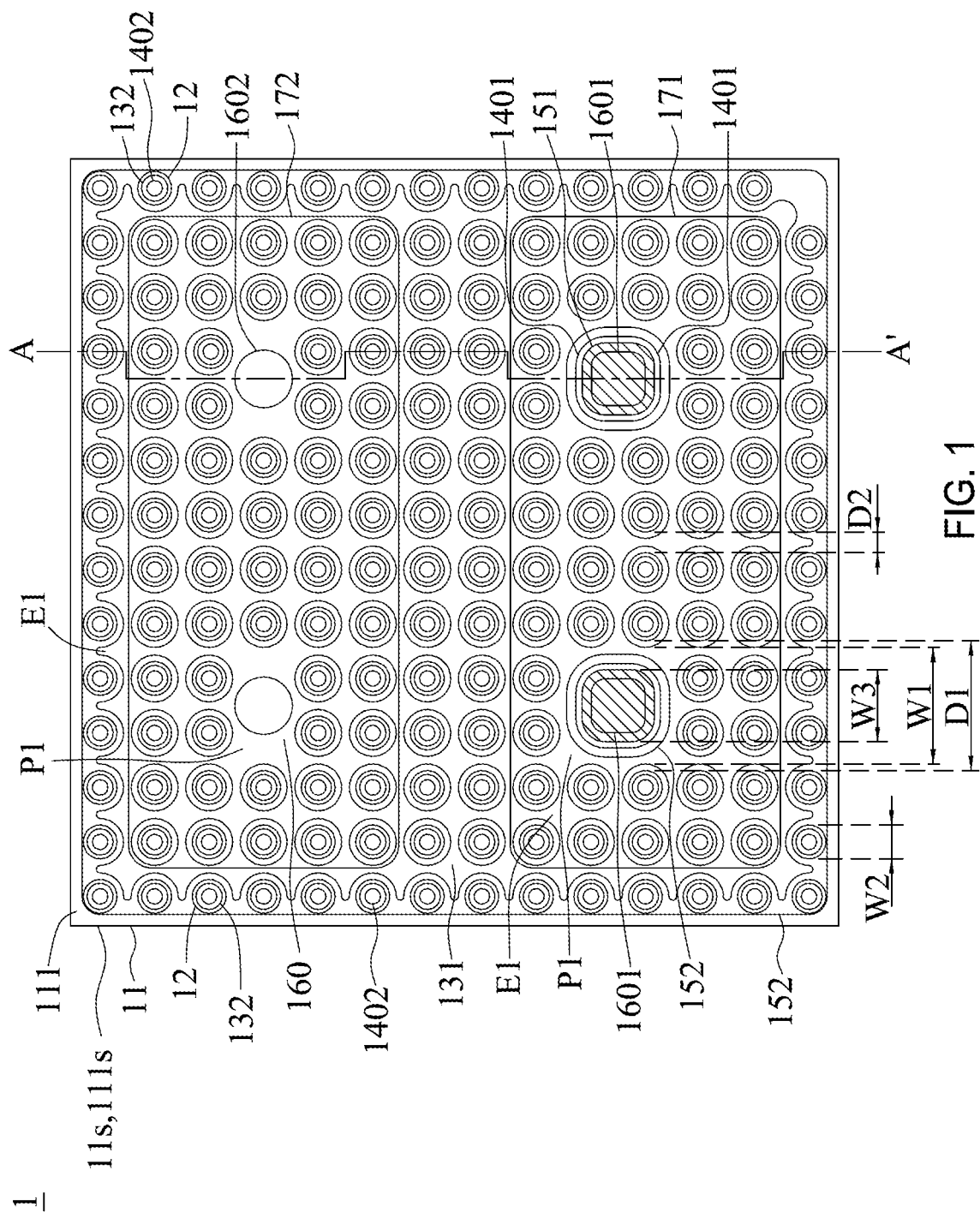
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
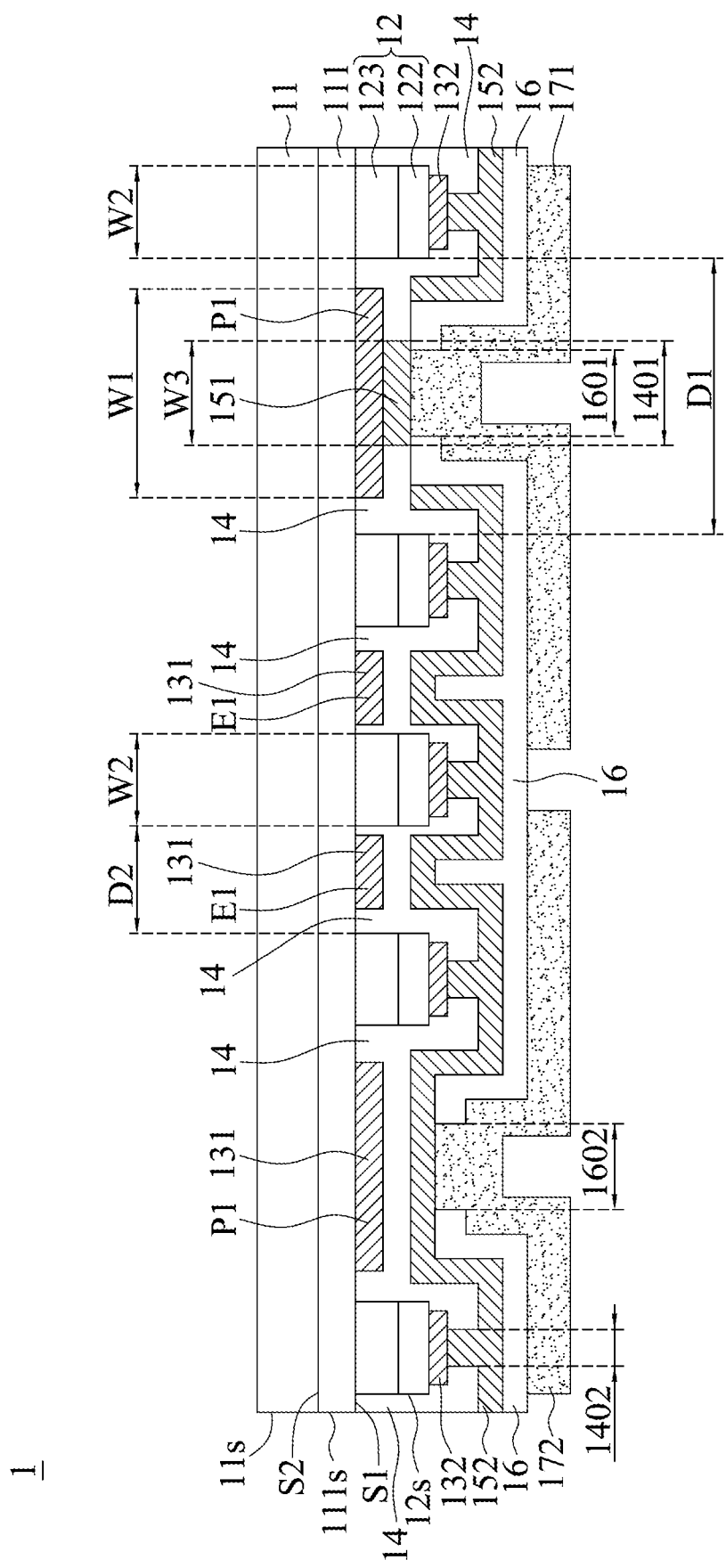
FIG. 2 illustrates a cross-sectional view of the light-emitting device 1 in accordance with an embodiment of the present application.

FIG. 1 illustrates a top view of a light-emitting device 1 in accordance with an embodiment of the present application. FIG. 2 illustrates a cross-sectional view of FIG. 1 along line A-A'.

As shown in FIG. 1 and FIG. 2, a light-emitting device 1 includes a substrate 11; and a semiconductor stack formed on the substrate 11, wherein the semiconductor stack includes a first semiconductor layer 111, and a plurality of semiconductor pillars 12 separated from each other and formed on the first semiconductor layer 111. The plurality of semiconductor pillars 12 each includes a second semiconductor layer 122 and an active layer 123. In an embodiment of the present application, the semiconductor pillar 12 includes a part of the first semiconductor layer 111, and the active layer 123 is formed between the first semiconductor layer 111 and the second semiconductor layer 122.

In an embodiment of the present application, the substrate 11 can be a growth substrate, including gallium arsenide (GaAs) wafer for growing aluminum gallium indium phosphide (AlGaInP), or sapphire (Al$_2$O$_3$) wafer, gallium nitride (GaN) wafer or silicon carbide (SiC) wafer for growing gallium nitride (GaN), indium gallium nitride (InGaN) or aluminum gallium nitride (AlGaN).

In an embodiment of the present application, a plurality of semiconductor layers including optical characteristics and consisting of semiconductor materials is formed on the substrate 11 by organic metal chemical vapor deposition (MOCVD), molecular beam epitaxy (MBE), hydride vapor deposition (HVPE), physical vapor deposition (PVD), or ion plating, wherein physical vapor deposition (PVD) including sputtering or evaporation. The plurality of semiconductor layers is patterned by lithography and etching to remove portions of the semiconductor layers and to form the semiconductor stack including the first semiconductor layer 111, and the plurality of semiconductor pillars 12 consisting of the active layer 123 and the second semiconductor layer 122. The first semiconductor layer 111 and the second semiconductor layer 122 can be cladding layers, have different conductivity types, electrical properties, polarities, or doping elements for providing electrons or holes. For example, the first semiconductor layer 111 is an n-type semiconductor and the second semiconductor layer 122 is a p-type semiconductor. The active layer 123 is formed between the first semiconductor layer 111 and the second semiconductor layer 122. The electrons and holes combine in the active layer 123 under a current driving to convert electric energy into light energy and then light is emitted from the active layer 123. The wavelength of the light emitted from the light-emitting device 1 is adjusted by changing the physical and chemical composition of one or more layers in the semiconductor stack. The material of the semiconductor stack includes a group III-V semiconductor material, such as Al$_x$In$_y$Ga$_{(1-x-y)}$N or Al$_x$In$_y$Ga$_{(1-x-y)}$P, wherein 0≤x, y≤1; (x+y)≤1. According to the material of the active layer 123, when the material of the semiconductor stack is AlInGaP series material, red light having a wavelength between 610 nm and 650 nm or yellow light having a wavelength between 550 nm and 570 nm can be emitted. When the material of the semiconductor stack is InGaN series material, blue or deep blue light having a wavelength between 400 nm and 490 nm or green light having a wavelength between 490 nm and 550 nm can be emitted. When the material of the semiconductor stack is AlGaN series material, UV light having a wavelength between 400 nm and 250 nm can be emitted. The active layer 123 can be a single heterostructure (SH), a double heterostructure (DH), a double-side double heterostructure (DDH), or a multi-quantum well structure, MQW). The material of the active layer 123 can be i-type, p-type, or n-type semiconductor.

In an embodiment of the present application, a buffer layer (not shown) is formed between the semiconductor stack and the substrate 11 to improve the epitaxial quality of the semiconductor stack. In an embodiment, an aluminum nitride (AlN) layer can be used as the buffer layer. In an embodiment, the method for forming aluminum nitride (AlN) is PVD, and the target is made of aluminum nitride. In another embodiment, a target made of aluminum which reacts in a nitrogen source environment with a PVD method is used to form aluminum nitride.

In an embodiment of the present application, the substrate 11 includes a sapphire (Al$_2$O$_3$) substrate, and the first semiconductor layer 111 includes an aluminum gallium nitride (AlGaN) layer. In order to reduce the epitaxial defects caused by the lattice difference between the AlGaN layer and the sapphire substrate, the AlN layer is formed as a buffer layer between the AlGaN layer and the sapphire substrate, wherein the AlN buffer layer includes a thickness greater than 300 nm, preferably greater than 1000 nm, and even greater than 2500 nm to fill the epitaxial defects. The aluminum nitride (AlN) buffer layer includes carbon (C), hydrogen (H), and/or oxygen (O) including a doping concentration lower than 2E+17. The aluminum (Al) composition percentage of the aluminum nitride (AlN) buffer layer is greater than that of aluminum gallium nitride (AlGaN) of the first semiconductor layer 111.

As shown in the top view of FIG. 1 and the cross-sectional view of FIG. 2 taken along line A-A' of FIG. 1, after the plurality of semiconductor layers is formed on the substrate 11, the plurality of semiconductor layers is patterned by lithography and etching to remove portions of the semiconductor layers and to form the semiconductor stack including the first semiconductor layer 111 and the plurality of semiconductor pillars 12 separated from each other, wherein the plurality of semiconductor pillars 12 each includes the second semiconductor layer 122 and the active layer 123.

In an embodiment of the present application, the semiconductor pillars 12 are separated from each other to expose a surface S1 of the first semiconductor layer 111. The substrate 11 includes a first sidewall 11s, the first semiconductor layer 111 includes a second sidewall 111s, and the plurality of semiconductor pillars 12 each includes a third sidewall 12s. As shown in FIG. 2, the first sidewall 11s of the substrate 11 is aligned to the second sidewall 111s of the first semiconductor layer 111. An inclined angle or a right angle is between the third sidewall 12s of the semiconductor pillar 12 and the surface S1 of the first semiconductor layer 111.

In an embodiment of the present application, the inclined angle between the third sidewall 12s of the semiconductor pillar 12 and the surface S1 of the first semiconductor layer 111 includes an angle between 10 degrees and 80 degrees, preferably less than 60 degrees, and more preferably less than 40 degrees.

In an embodiment of the present application, the first sidewall 11s of the substrate 11 is separated from the second sidewall 111s of the first semiconductor layer 111 by a distance to expose a surface S2 of the substrate 11. An obtuse angle or a right angle is between the second sidewall 111s of the first semiconductor layer 111 and the surface S2 of the substrate 11.

In an embodiment of the present application, an inclined angle between the second sidewall 111s of the first semiconductor layer 111 and the surface S2 of the substrate 11 includes an angle between 10 degrees and 80 degrees, preferably less than 60 degrees, and more preferably less than 40 degrees. A height between the surface S1 of the first semiconductor layer 111 and the surface S2 of the substrate 11 is greater than 4000 Å, preferably greater than 6000 Å, and more preferably greater than 8000 Å.

In an embodiment of the present application, the surface S2 of the substrate 11 is a flat surface, wherein the flat surface includes a roughness (Root mean square roughness, Rq) less than 8 nm, preferably less than 5 nm, and more preferably less than 2 nm.

In an embodiment of the present application, the surface S2 of the substrate 11 includes a patterned surface (not shown), wherein the patterned surface includes a plurality of recesses extending from the surface S2 of the substrate 11 toward the interior of the substrate 11 or a plurality of protrusions extending from the surface S2 of the substrate 11 toward the surface S1 of the first semiconductor layer 111.

From the top view of the light-emitting device 1, the plurality of recesses or the plurality of protrusions each includes a circle, an ellipse, a rectangle, a polygon, or any other shape. From the top view of the light-emitting device 1, the plurality of recesses or the plurality of protrusions each includes a bottom portion that is flush with the surface S2 of the substrate 11, and a top portion that is opposite to the bottom portion. The top portion may be a flat surface or a point. The depth or the height between the top portion and the bottom portion is between 0.1 μm and 2 μm, preferably between 0.2 μm and 0.9 μm, and more preferably between 0.5 μm and 0.7 μm. The bottom portion includes a width or a diameter between 0.05 μm and 1 μm, preferably between 0.2 μm and 0.8 μm, and more preferably between 0.3 μm and 0.5 μm.

In an embodiment of the present application, viewing from the top view of the light-emitting device 1 shown in FIG. 1, the semiconductor pillars 12 each includes a circle, an ellipse, a rectangle, a polygon, or any other shape.

In an embodiment of the present application, reducing the diameter or the width of the semiconductor pillar 12 can reduce the forward voltage ($V_f$) of the light-emitting device 1. From the top view of the light-emitting device 1, the semiconductor pillar 12 includes a diameter or a width greater than 4 μm and/or less than 80 μm, preferably less than 50 μm, and more preferably less than 20 μm.

In an embodiment of the present application, the semiconductor pillars 12 are arranged in a plurality of columns, and the semiconductor pillars 12 arranged in any two adjacent columns or every two adjacent columns can be aligned with each other or staggered.

In an embodiment of the present application, the semiconductor pillars 12 can be arranged in a first column and a second column. A first shortest distance is between two adjacent semiconductor pillars 12 in the same column, and a second shortest distance is between one of the semiconductor pillars 12 in the first column and another adjacent one of the semiconductor pillars 12 in the second column, wherein the first shortest distance is greater than or less than the second shortest distance. When an external current is injected into the light-emitting device 1, the dispersed disposition of the plurality of semiconductor columns 12 uniforms the light field distribution of the light-emitting device 1 and reduces the forward voltage of the light-emitting device 1.

In an embodiment of the present application, the semiconductor pillars 12 can be arranged in a first column, a second column and a third column. A first shortest distance is between one of the semiconductor pillars 12 in the first column and another one of the semiconductor pillars 12 in the second column, and a second shortest distance is between one of the semiconductor pillars 12 in the second column and another one of the semiconductor pillars 12 in the third column, wherein the first shortest distance is less than the second shortest distance. When an external current is injected into the light-emitting device 1, the dispersed disposition of the plurality of semiconductor columns 12 uniforms the light field distribution of the light-emitting device 1 and reduces the forward voltage of the light-emitting device 1.

A first contact layer 131 is formed on the surface S1 of the first semiconductor layer 111 by physical vapor deposition or chemical vapor deposition. The material of the first contact layer 131 includes metal material, such as chromium (Cr), titanium (Ti), tungsten (W), gold (Au), aluminum (Al), indium (In), tin (Sn), nickel (Ni), platinum (Pt), rhodium (Rh), or an alloy of the above materials.

In an embodiment of the present application, the light emitted from the light-emitting device 1 includes a wavelength longer than 370 nm, and the material of the first contact layer 131 includes a metal having high reflectivity, such as silver (Ag), aluminum (Al), platinum (Pt) or rhodium (Rh). In order to increase the reflectivity of the first contact layer 131, the metal layer of silver (Ag), aluminum (Al), platinum (Pt), or rhodium (Rh) includes a thickness greater than 400 angstroms (Å), preferably greater than 800 angstroms (Å), and more preferably greater than 1200 angstroms (Å).

In an embodiment of the present application, the light emitted from the light-emitting device 1 includes a wavelength shorter than 370 nm, and the material of the first contact layer 131 does not include silver (Ag).

In an embodiment of the present application, one side of the first contact layer 131 contacting with the surface S1 of the first semiconductor layer 111 includes chromium (Cr) or titanium (Ti) to increase the bonding strength between the first contact layer 131 and the first semiconductor layer 111. In order to reduce the light loss, the thickness of chromium (Cr) or titanium (Ti) layer is lower than 1000 angstroms (Å), preferably lower than 600 angstroms (Å), and more preferably lower than 400 angstroms (Å). And, in order to maintain sufficient bonding strength, chromium (Cr) and/or titanium (Ti) layers include a thickness greater than 10 angstroms (Å), preferably greater than 50 angstroms (Å), and more preferably greater than 100 angstroms (Å).

In an embodiment of the present application, the first semiconductor layer 111 includes $Al_xGa_{(1-x)}N$, where $0.3<x<0.8$, preferably $0.35<x<0.7$, and more preferably $0.4<x<0.6$. In order to form an ohmic contact between the first contact layer 131 and the surface S1 of the first semiconductor layer 111, and maintain a sufficient bonding strength therebetween, the first contact layer 131 includes titanium (Ti) and aluminum (Al), wherein a ratio of a titanium (Ti) layer to an aluminum (Al) layer is between 0.1 and 0.2.

In an embodiment of the present application, the first contact layer 131 includes a first contact portion P1 and a first extending portion E1. The first contact portion P1 includes a projected area on the first semiconductor layer 111 that is larger than a projected area of one of the plurality of semiconductor pillars 12 on the first semiconductor layer 111, wherein the projected area refers to a surface area along a normal direction perpendicular to the surface S2 of the substrate 11. As shown in FIG. 1, the first extending portion E1 extends from the first contact portion P1 and surrounds the plurality of semiconductor pillars 12.

In an embodiment of the present application, the first contact layer 131 includes a plurality of first contact portions P1 and a plurality of first extending portions E1, wherein the plurality of first extending portions E1 is extended from the plurality of first contact portions P1 and are connected to each other, and the plurality of first contact portions P1 is electrically connected by the plurality of first extending portions E1.

As shown in FIG. 2, in an embodiment of the present application, the first contact portion P1 of the first contact layer 131 includes a width larger than a width of the first extending portion E1.

A second contact layer 132 is formed on the second semiconductor layer 122 of the semiconductor pillar 12 by physical vapor deposition or chemical vapor deposition. The material of the second contact layer 132 includes metal, such as chromium (Cr), titanium (Ti), tungsten (W), gold (Au), aluminum (Al), indium (In), tin (Sn), nickel (Ni), platinum (Pt), rhodium (Rh), or an alloy of the above materials.

In an embodiment of the present application, the light emitted from the light-emitting device 1 includes a wavelength longer than 370 nm, and the material of the second contact layer 132 includes a metal having high reflectivity, such as silver (Ag), aluminum (Al), platinum (Pt) or rhodium (Rh). In order to increase the reflectivity of the second contact layer 132, the metal layer of silver (Ag), aluminum (Al), platinum (Pt), or rhodium (Rh) includes a thickness greater than 400 angstroms (Å), preferably greater than 800 angstroms (Å), and more preferably greater than 1200 angstroms (Å).

In an embodiment of the present application, the light emitted from the light-emitting device 1 includes a wavelength shorter than 370 nm, and the material of the second contact layer 132 does not include silver (Ag).

In an embodiment of the present application, a plurality of second contact layers 132 are respectively formed on the second semiconductor layer 122 of the plurality of semiconductor pillars 12, and the plurality of second contact layers 132 are separated from each other.

In an embodiment of the present application, the second semiconductor layer 122 includes GaN, AlGaN or BN, and the second semiconductor layer 122 includes a doping element such as magnesium (Mg) to form a p-type semiconductor, wherein the doping element includes a concentration greater than 9E+18, preferably greater than 4E+19, and more preferably greater than 1E+20. The second contact layer 132 includes a transparent conductive material that is transparent to the light emitted from the active layer 123 and capable of forming ohmic contact with the second semiconductor layer 122. The transparent conductive material includes a non-metal material such as graphene, metal, or metal oxide such as indium tin oxide (ITO) or indium zinc oxide (IZO). The second contact layer 132 is substantially formed on the entire surface of the second semiconductor layer 122 and contacts the second semiconductor layer 122. The electrical current is uniformly spread into the second semiconductor layer 122 through the second contact layer 132. In an embodiment of the present application, the second contact layer 132 includes graphene, and the second contact layer 132 further includes a thin metal layer or a thin metal oxide layer with material such as nickel oxide (NiO), cobalt oxide ($Co_3O_4$), or copper oxide ($Cu_2O$) formed between the second semiconductor layer 122 and the graphene layer for forming ohmic contact with the second semiconductor layer 122. The thin metal layer or thin metal oxide layer includes a thickness between 0.1 and 100 nm, preferably between 0.1 and 50 nm, more preferably between 0.1 and 20 nm. In an embodiment of the present application, the thickness of the second contact layer 132 is between 0.1 nm and 100 nm. If the thickness of the second contact layer 132 is less than 0.1 nm, an ohmic contact with the second semiconductor layer 122 cannot be formed therebetween because the thickness is too thin. Besides, if the thickness of the second contact layer 132 is greater than 100 nm, the second contact layer 132 is too thick to partially absorb light emitted from the active layer 123, and the luminance of the light-emitting device 1 is reduced.

In an embodiment of the present application, The positions of the first contact layer 131 and the second contact layers 132 formed on the semiconductor stack are misaligned and do not overlap each other.

A first insulating layer 14 is formed by physical vapor deposition or chemical vapor deposition to depositing an insulating material layer on the first contact layer 131 and the second contact layer 132. The first insulating layer 14 is formed by patterning a portion of the insulating material layer by lithography and etching, and a first opening 1401 of the first insulating layer 14 is formed on the first contact layer 131 to expose the first contact layer 131 and a second opening 1402 of the first insulating layer 14 is formed on the second contact layer 132 to expose the second contact layer 132.

In an embodiment of the present application, the first contact layer 131 includes the plurality of first contact portions P1 and the plurality of first extending portions E1. The first insulating layer 14 includes a plurality of first openings 1401 respectively formed on the plurality of first contacts P1, wherein the plurality of first extending portions E1 is covered by the first insulating layer 14.

In an embodiment of the present application, the first insulating layer 14 includes a plurality of second openings 1402 respectively formed on the plurality of semiconductor pillars 12. In other words, an amount of the plurality of second openings 1402 is same as that of the plurality of semiconductor pillars 12.

In an embodiment of the present application, an amount of the plurality of second openings 1402 of the first insulating layer 14 is larger than that of the plurality of first openings 1401.

In an embodiment of the present application, the second opening 1402 of the first insulating layer 14 includes a width smaller than that of the first opening 1401.

In an embodiment of the present application, the first insulating layer 14 covers the third sidewalls 12s of the plurality of semiconductor pillars 12, covers the surface S1 of the first semiconductor layer 111, covers the second sidewall 111s of the first semiconductor layer 111, and/or covers the surface S2 of the substrate 11.

In an embodiment of the present application, the first insulating layer 14 protects the semiconductor structure, and includes two or more layers having different refractive indexes alternately stacked to form a Distributed Bragg reflector (DBR). The DBR selectively reflects light of a specific wavelength. The first insulating layer 14 is formed of a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

A first electrode contact layer 151 and a second electrode contact layer 152 are respectively formed in the first opening 1401 and the second opening 1402 of the first insulating layer 14 by physical vapor deposition or chemical vapor deposition, and extend and cover portions of the surface of the first insulating layer 14. The first electrode contact layer 151 is connected to the first contact portion P1 of the first contact layer 131 through the first opening 1401 of the first insulating layer 14. The second electrode contact layer 152 is connected to the plurality of second contact layers 132 through the second opening 1402 of the first insulating layer 14.

In an embodiment of the present application, the second electrode contact layer 152 covers the plurality of semiconductor pillars 12 and portions of the first contact layer 131, wherein the second electrode contact layer 152 is electrically isolated from the first contact layer 131 by the first insulating layer 14.

In an embodiment of the present application, the first contact layer 131 includes the first contact portion P1 including a width W1 larger than a width W2 of the semiconductor pillar 12, the width W1 of the first contact portion P1 of the first contact layer 131 is larger than the width W3 of the first electrode contact layer 151, and the width W3 of the first electrode contact layer 151 is larger than the width W2 of the semiconductor pillar 12.

In an embodiment of the present application, the first electrode contact layer 151 covers portions of the first contact layer 131, the second electrode contact layer 152 covers all of the second contact layers 132.

In an embodiment of the present application, the first electrode contact layer 151 covers portions of the first contact layer 131, the second electrode contact layer 152 covers portions of the second contact layers 132.

In an embodiment of the present application, the first electrode contact layer 151 covers all of the first contact layer 131, the second electrode contact layer 152 covers portions of the second contact layers 132.

In an embodiment of the present application, the first electrode contact layer 151 and the second electrode contact layer 152 are separated from each other by a distance. In the top view of the light-emitting device 1, the second electrode contact layer 152 surrounds multiple sidewalls of the first electrode contact layer 151.

In an embodiment of the present application, in the top view of the light-emitting device 1, the second electrode contact layer 152 includes an area larger than an area of the first electrode contact layer 151.

In an embodiment of the present application, when an external current is injected into the light-emitting device 1, the electrical current is conducted to the first semiconductor layer 111 and the second semiconductor layer 122 by the first electrode contact layer 151 and the second electrode contact layer 152.

As shown in FIG. 1, the first electrode contact layer 151 is close to one side of the substrate 11, such as the left or right side of a centerline of the substrate 11.

In an embodiment of the present application, the material of the first electrode contact layer 151 and the second electrode contact layer 152 include a metal material, such as chromium (Cr), titanium (Ti), tungsten (W), gold (Au), aluminum (Al), indium (In), tin (Sn), nickel (Ni), platinum (Pt), rhodium (Rh), or an alloy of the above materials.

In an embodiment of the present application, the light emitted from the light-emitting device 1 includes a wavelength shorter than 370 nm, and the material of the first electrode contact layer 151 and the second electrode contact layer 152 do not include silver (Ag). The material of the first electrode contact layer 151 and the second electrode contact layer 152 includes a metal having a high reflectivity for the UV light, such as aluminum (Al), platinum (Pt) or rhodium (Rh). In order to increase the reflectivity of the first electrode contact layer 151 and the second electrode contact layer 152 for the UV light, the layer including aluminum (Al), platinum (Pt), or rhodium (Rh) includes a thickness greater than 4000 angstroms (Å), preferably greater than 8000 angstroms (Å), and more preferably greater than 10000 angstroms (Å).

In an embodiment of the present application, one side of the first electrode contact layer 151 contacting with the first contact layer 131 includes chromium (Cr) or titanium (Ti) to increase the bonding strength between the first electrode contact layer 151 and the first contact layer 131. The second electrode contact layer 152 contacting with the second contact layer 132 includes chromium (Cr) or titanium (Ti) to increase the bonding strength between the second electrode contact layer 152 and the second contact layer 132. In order to reduce the brightness loss caused by the ultraviolet light of chromium (Cr) or titanium (Ti) material, a thickness of the layer including chromium (Cr) or titanium (Ti) material is lower than 1000 angstroms (Å), preferably lower than 800 angstroms (Å), and more preferably lower than 500 angstroms (Å). And, in order to maintain sufficient bonding strength, the layer including chromium (Cr) and/or titanium (Ti) includes a thickness greater than 10 angstroms (Å), preferably greater than 50 angstroms (Å), and more preferably greater than 100 angstroms (Å).

A second insulating layer 16 is formed by physical vapor deposition or chemical vapor deposition to deposit an insulating material layer on the first electrode contact layer 151 and the second electrode contact layer 152. Then, the insulating material layer is patterned by lithography and etching to form the second insulating layer 16, and the first opening 1601 and the second opening 1602 of the second insulating layer 16 respectively exposing the first electrode contact layer 151 and the second electrode contact layer 152.

In an embodiment of the present application, the second insulating layer 16 includes one or a plurality of first openings 1601 and one or a plurality of second openings 1602, wherein an amount of the plurality of first openings 1601 and an amount of the plurality of second openings 1602 are the same or different.

In an embodiment of the present application, the plurality of first openings 1601 of the second insulating layer 16 are respectively formed on the plurality of first electrode contact layers 151, wherein an amount of the plurality of first openings 1601 and an amount of the plurality of first electrode contact layers 151 are the same.

In the top view of FIG. 1, the first opening 1601 and the second opening 1602 of the second insulating layer 16 are respectively formed on two sides of the centerline of the substrate 11. For example, the first opening 1601 of the second insulating layer 16 is formed on the right side of the centerline of the substrate 11, and the second opening 1602 of the second insulating layer 16 is formed on the left side of the centerline of the substrate 11.

In an embodiment of the present application, the first opening 1601 of the second insulating layer 16 includes a width smaller than a width of the first opening 1401 of the first insulating layer 14.

In an embodiment of the present application, the first opening 1601 of the second insulating layer 16 overlaps the first opening 1401 of the first insulating layer 14, and the first opening 1601 of the second insulating layer 16 and the first opening 1401 of the first insulating layer 14 are both formed on the first contact layer 131.

In an embodiment of the present application, the second opening 1602 of the second insulating layer 16 and the second opening 1402 of the first insulating layer 14 are misaligned. Specifically, the second opening 1402 of the first insulating layer 14 is formed on the second contact layer 132, and the second opening 1602 of the second insulating layer 16 is formed on the first contact layer 131.

In an embodiment of the present application, when the second insulating layer 16 includes a stack structure, and the stack structure includes two or more sublayers; wherein the sublayers have two materials with different refractive indexes alternately stacked to form a Distributed Bragg reflector (DBR). The DBR selectively reflects light of a specific wavelength. The second insulating layer 16 is formed of a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

A first electrode 171 and a second electrode 172 are formed on the second insulating layer 16 by electroplating, physical vapor deposition or chemical vapor deposition. In the top view of FIG. 1, the first electrode 171 is close to one side of the substrate 11, such as the right side of the centerline of the substrate 11, and the second electrode 172 is close to the other side of the substrate 11, such as the left side of the centerline of the substrate 11. The first electrode 171 covers the first opening 1601 of the second insulating layer 16 to be in contact with the first electrode contact layer 151, and is electrically connected with the first semiconductor layer 111 by the first contact layer 131. The second electrode 172 covers the second opening 1602 of the second insulating layer 16 to be in contact with the second electrode contact layer 152, and is electrically connected with the second semiconductor layer 122 by the second contact layer 132.

In an embodiment of the present application, the plurality of semiconductor pillars 12 formed under a covering area of the first electrode 171 includes a first space D1 to separate from each other. The plurality of semiconductor pillars 12 outside the covering area of the first electrode 171 includes a second space D2 to separate from each other, and the first spacing D1 is greater than the second spacing D2.

In an embodiment of the present application, the light emitting device 1 further includes a semiconductor mesa. The semiconductor mesa includes a first semiconductor layer, an active layer and a second semiconductor layer, and is formed under the first electrode 171, wherein the plurality of semiconductor pillars 12 formed outside the covering area of the first electrode 171 includes a second space D2 to separate from each other, and the second semiconductor layer of the semiconductor mesa includes a width larger than the second space D2 between the plurality of semiconductor pillars 12.

In an embodiment of the present application, the first contact portion P1 of the first contact layer 131 is formed under the first electrode 171 and/or the second electrode 172. The first extending portion E1 of the first contact layer 131 is formed under the first electrode 171 and the second electrode 172.

In an embodiment of the present application, the first electrode 171 includes a size equal to or different from a size of the second electrodes 172. The size includes width or area.

In an embodiment of the present application, in the top view of the light-emitting device 1, the shape of the first electrode 171 is the same as or similar to that of the second electrode 172, for example, the shapes of the first electrode 171 and the second electrode 172 are rectangular, as shown in FIG. 1.

In an embodiment of the present application, the first electrode 171 and the second electrode 172 include metal materials, such as chromium (Cr), titanium (Ti), tungsten (W), aluminum (Al), indium (In), tin (Sn), nickel (Ni), platinum (Pt) or an alloy of the above materials. The first electrode 171 and the second electrode 172 include a single layer or multiple layers. When the first electrode 171 and the second electrode 172 include multiple layers, the first electrode 171 includes a first upper pad and a first lower pad, and the second electrode 172 includes a second upper pad and a second lower pad. The upper pads and the lower pads have different functions.

In an embodiment of the present application, the function of the upper pad is mainly used for soldering and wire bonding. With the upper pad, the light-emitting device 1 can be mounted on a package substrate in a flip-chip form using solder or eutectic bonding, for example, an AuSn bonding. The metal material of the upper pad includes high-ductility material, such as tin (Sn), nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru) osmium (Os), or alloys thereof. The upper pad can be a single layer or a laminated structure of the above materials. In an embodiment of the present application, the material of the upper pad includes nickel (Ni) and/or gold (Au), and the upper pad is a single layer or a laminated structure In an embodiment of the present application, the function of the lower pad is to form a stable interface with the first electrode contact layer 151 and the second electrode contact layer 152, for example, to increase the interface bonding strength between the first lower pad and the first electrode contact layer 151, or to increase the interface bonding strength between the second lower pad and the second electrode contact layer 152. Another function of the lower pad is to prevent tin (Sn) in the solder or AuSn eutectic from diffusing into the reflective structure that destroys the reflectivity of the reflective structure. Therefore, the lower pad includes metal materials other than gold (Au), copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os) or an alloy of the above materials. The lower pad can be a single layer or a laminated structure of the above materials. In an embodiment of the present application, the lower pad includes a laminated structure of titanium (Ti)/aluminum (Al) or a laminated structure of chromium (Cr)/aluminum (Al).

In an embodiment of the present application, in order to prevent tin (Sn) in the solder or AuSn eutectic from diffusing into the reflective structure that destroys the reflectivity of the reflective structure, one side of the first electrode contact layer 151 contacting with the first electrode 171 includes a metal material selected from the group consisting of titanium (Ti) and platinum (Pt). One side of the second electrode contact layer 152 contacting with the second electrode 172 includes a metal material selected from the group consisting of titanium (Ti) and platinum (Pt).

FIG. 3A illustrates a partial cross-sectional view of a light-emitting device 2A in accordance with an embodiment of the present application. FIG. 3B illustrates a partial top view of the light-emitting device 2A in accordance with an embodiment of the present application. Since the light-emitting device 2A and the light-emitting device 1 have substantially the same structure, the descriptions about the same structure of the light-emitting device 2A and the light-emitting device 1 will be appropriately omitted or will not be repeated.

As shown in FIG. 3A and FIG. 3B, the light-emitting device 2A illustrates another example of the structural embodiment of the semiconductor pillar 12 of the light-emitting device 1 illustrated in FIG. 1. In an embodiment of the present application, the semiconductor stack includes a first semiconductor layer 221, an active layer 223, and a semiconductor pillar 22 on the active layer 223. The active layer 223 includes one or more well layers and one or more barrier layer alternatively stacked, wherein the well layer includes $Al_xGa_{1-x}N$ and 0.2<x<0.4, and the barrier layer includes $Al_yGa_{1-y}N$ and 0.4<y<0.7. The semiconductor pillar 12 shown in the light-emitting device 1 of FIG. 2 can be replaced by the semiconductor pillar 22 shown in FIGS. 3A and 3B, the semiconductor pillar 22 includes a second semiconductor layer 222. In an embodiment of the present application, the semiconductor pillar 22 further includes a portion of the active layer 223. The active layer 223 is formed between the first semiconductor layer 221 and the second semiconductor layer 222, and the active layer 223 emits a UV light.

In an embodiment of the present application, the substrate 11 includes a first sidewall 11s, the first semiconductor layer 221 includes a second sidewall 221s, the second semiconductor layer 222 includes a third sidewall 222s, and the active layer 223 includes a sidewall 223s. As shown in FIG. 3A, the third sidewall 222s of the second semiconductor layer 222 is separated from the sidewall 223s of the active layer 223 by a distance to expose a surface S3 of the active layer 223, wherein the exposed surface S3 of the active layer 223 can be the well layer or the barrier layer, the well layer includes $Al_xGa_{1-x}N$ and 0.2<x<0.4, and the barrier layer includes $Al_yGa_{1-y}N$ and 0.4<y<0.7. An obtuse angle or a right angle is between the third sidewall 222s of the second semiconductor layer 222 and the surfaces S3 of the active layer 223.

In an embodiment of the present application, in the top view of the light-emitting device 2A shown in FIG. 3B, the second semiconductor layer 222 each includes a circle, an ellipse, a rectangle, a polygon, or any other shape. The second semiconductor layer 222 is surrounded by the active layer 223, and part of the surface S3 of the active layer 223 is exposed to be formed outside the covering area of the second semiconductor layer 222. Part of the surface S3 of the active layer 223 is not covered by the second semiconductor layer 222, wherein the exposed surface S3 of the active layer 223 can be the well layer or the barrier layer, the well layer includes $Al_xGa_{1-x}N$ and 0.2<x<0.4, and the barrier layer includes $Al_yGa_{1-y}N$ and 0.4<y<0.7.

In an embodiment of the present application, the active layer 223 is surrounded by the first semiconductor layer 221, and part of the surface S1 of the first semiconductor layer 221 is exposed to be formed outside the covering area of the active layer 223, wherein the first semiconductor layer 221 includes AlGaN. The part of the surface S1 of the first semiconductor layer 221 is not covered by the active layer 223.

FIG. 4A illustrates a partial cross-sectional view of a light-emitting device 2B in accordance with an embodiment of the present application. FIG. 4B illustrates a partial top view of the light-emitting device 2B in accordance with an embodiment of the present application. Since the light-emitting device 2B and the light-emitting device 1 have substantially the same structure, the descriptions about the same structure of the light-emitting device 2B and the light-emitting device 1 will be appropriately omitted or will not be repeated.

As shown in FIG. 4A and FIG. 4B, the light-emitting device 2B illustrates another example of the structural embodiment of the semiconductor pillar 12 of the light-emitting device 1 illustrated in FIG. 2. In an embodiment of the present application, the semiconductor stack includes a first semiconductor layer 321, an active layer 323, and a plurality of semiconductor pillars 32 on the first semiconductor layer 321. The semiconductor pillars 32 each includes a second semiconductor layer 322, and the active layer 323 emits a UV light.

In an embodiment of the present application, the semiconductor pillar 32 further includes part of the active layer 323. The active layer 323 is formed between the first semiconductor layer 321 and the second semiconductor layer 322, and the active layer 323 emits UV light.

In an embodiment of the present application, in the top view of the light-emitting device 2B shown in FIG. 4B, the second semiconductor layer 322 each includes a circle, an ellipse, a rectangle, a polygon, or any other shape. The second semiconductor layer 322 is surrounded by the active layer 323, and part of the surface S3 of the active layer 323 is exposed to be formed outside the covering area of the second semiconductor layer 322. The part of the surface S3 of the active layer 323 is not covered by the second semiconductor layer 323. The active layer 323 is surrounded by the first semiconductor layer 321, and part of the surface S1 of the first semiconductor layer 321 is exposed outside the coverage area of the active layer 323. The part of the surface S1 of the first semiconductor layer 321 is not covered by the active layer 323, wherein the first semiconductor layer 321 includes AlGaN.

Figure 5:
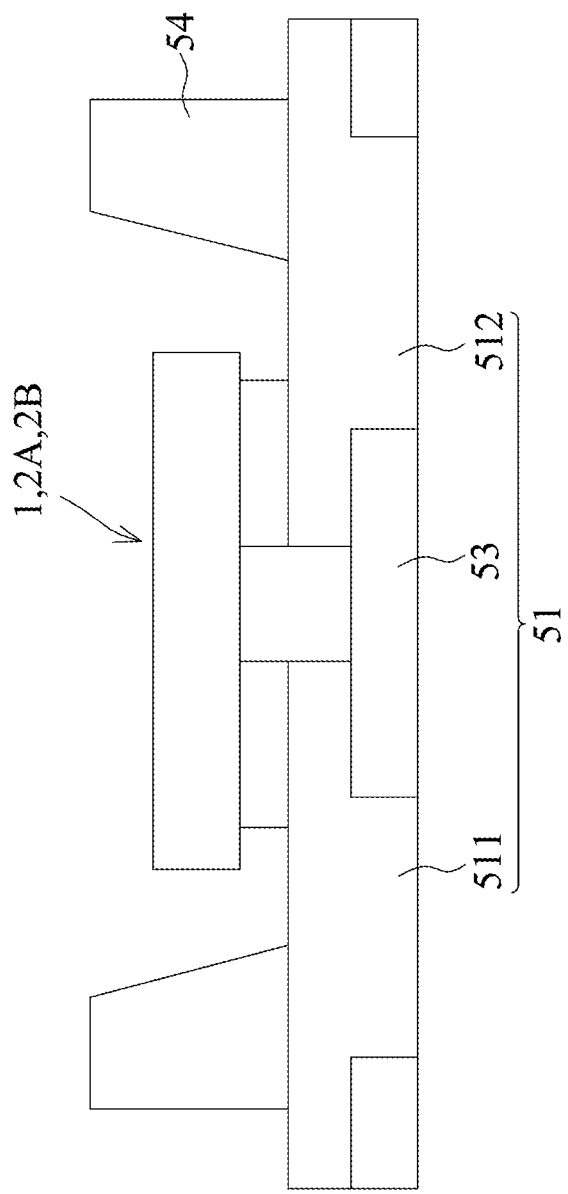
FIG. 5 illustrates a schematic view of a light-emitting apparatus 3 in accordance with an embodiment of the present application.

FIG. 5 is a schematic view of a light-emitting apparatus 3 in accordance with an embodiment of the present application. The light-emitting device 1, 2A, or 2B in the foregoing embodiment is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip chip is one side of the growth substrate 11 opposite to the electrode-forming surface where the electrodes are formed on. A reflective structure 54 can be provided around the light-emitting device 1, 2A, or 2B to increase the light extraction efficiency of the light-emitting apparatus 3.

Figure 6:
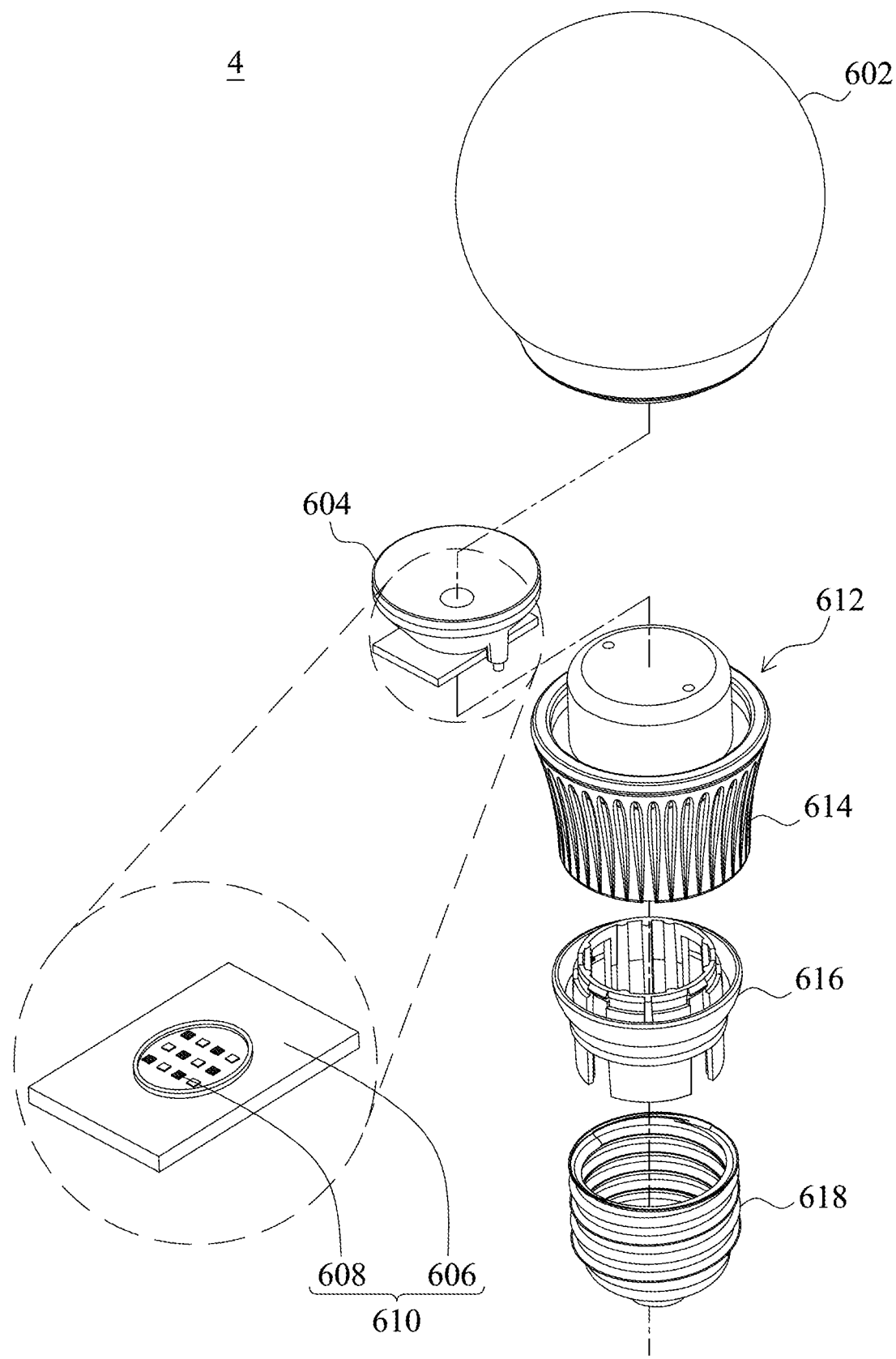
FIG. 6 illustrates a structure diagram of a light-emitting apparatus 4 in accordance with an embodiment of the present application.

FIG. 6 illustrates a structure diagram of a light-emitting apparatus 4 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting device 1, 2A, or 2B or the light-emitting apparatus 3 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:
1. A light-emitting device, comprising:
a first semiconductor layer;
a plurality of semiconductor pillars separated from each other and formed on the first semiconductor layer, the plurality of semiconductor pillars each comprising a second semiconductor layer and an active layer;

a first contact layer formed on the first semiconductor layer;

a plurality of second contact layers respectively formed on the plurality of semiconductor pillars;

a first electrode contact layer formed on the first contact layer;

a second electrode contact layer covering the plurality of second contact layers;

a first electrode covering a first group of semiconductor pillars in the plurality of semiconductor pillars; and a second electrode covering a second group of semiconductor pillars in the plurality of semiconductor pillars, wherein a first spacing separates the semiconductor pillars of the first group in the plurality of semiconductor pillars which are under a region covered by the first electrode from each other, a second spacing separates the semiconductor pillars of the second group in the plurality of semiconductor pillars which are outside of the region covered by the first electrode from each other, and the first spacing is larger than the second spacing, wherein the first contact layer is covered by the first electrode and the second electrode.

2. The light-emitting device according to claim 1, wherein the first contact layer and the plurality of second contact layers do not overlap each other.

3. The light-emitting device according to claim 1, wherein the first contact layer comprises a first contact portion and a plurality of first extending portions connected to each other.

4. The light-emitting device according to claim 3, wherein the first contact portion comprises a projected area on the first semiconductor layer that is larger than a projected area of one of the plurality of semiconductor pillars on the first semiconductor layer.

5. The light-emitting device according to claim 3, further comprising a first insulating layer comprising a first opening exposing the first contact portion, wherein the first insulating layer covers the plurality of first extending portions.

6. The light-emitting device according to claim 1, wherein the first contact layer comprises a plurality of first contact portions and a plurality of first extending portions connected to each other.

7. The light-emitting device according to claim 6, wherein one of the plurality of first contact portions of the first contact layer comprises a width larger than a width of one of the plurality of first extending portions.

8. The light-emitting device according to claim 6, wherein the plurality of first contact portions is covered by the first electrode and the second electrode.

9. The light-emitting device according to claim 1, further comprising a first insulating layer comprising a plurality of second openings respectively formed on the plurality of second contact layers.

10. The light-emitting device according to claim 1, wherein the second electrode contact layer surrounds multiple sidewalls of the first electrode contact layer.

11. The light-emitting device according to claim 1, wherein the first electrode contact layer comprises a width larger than a width of one of the plurality of semiconductor pillars.

12. The light-emitting device according to claim 1, wherein the first contact layer comprises a width larger than a width of one of the plurality of semiconductor pillars.

13. The light-emitting device according to claim 1, wherein the first electrode contact layer and the second electrode contact layer are covered by the first electrode.

14. The light-emitting device according to claim 13, further comprising a second insulating layer comprising a first opening formed on the first electrode contact layer, and the first electrode contacting the first electrode contact layer through the first opening.

15. The light-emitting device according to claim 1, wherein the second semiconductor layer comprises a sidewall separated from a sidewall of the active layer.

16. The light-emitting device according to claim 15, wherein a surface of the active layer is not covered by the second semiconductor layer.

17. The light-emitting device according to claim 1, wherein the plurality of second contact layers comprises a transparent conductive material.

18. The light-emitting device according to claim 17, wherein the first contact layer comprises a metal material.

* * * * *